(12) United States Patent
Lai

(10) Patent No.: US 6,916,691 B1
(45) Date of Patent: Jul. 12, 2005

(54) METHOD OF FABRICATING THIN FILM TRANSISTOR ARRAY SUBSTRATE AND STACKED THIN FILM STRUCTURE

(75) Inventor: Han-Chung Lai, Taoyuan Hsien (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 10/709,089

(22) Filed: Apr. 13, 2004

(30) Foreign Application Priority Data

Feb. 27, 2004 (TW) ..................... 93105043 A

(51) Int. Cl.[7] .............................. H01L 21/00
(52) U.S. Cl. ............ 438/149; 438/73; 438/151; 438/197
(58) Field of Search ................ 438/257, 149, 438/689

(56) References Cited

U.S. PATENT DOCUMENTS 4,715,930 A * 12/1987 Diem ..................... 438/160

* cited by examiner

*Primary Examiner*—Thao P. Le
(74) *Attorney, Agent, or Firm*—Jianq Chyun IP office

(57) ABSTRACT

A method of fabricating a thin film transistor array substrate is provided. First, a first patterned metallic layer, a dielectric layer, an amorphous silicon layer, a second patterned metallic layer and a passivation layer are sequentially formed over a substrate. A patterned photoresist layer is formed over the passivation layer. The patterned photoresist layer at least covers the source/drain (formed out of the first patterned metallic layer) as well as the area beside them. The edges of the patterned photoresist layer have a plurality of thin-out regions. Each thin-out region stretches across part of the edge of one source/drain. Thereafter, using the patterned photoresist layer as an etching mask, an etching operation is carried out until the source/drain and its peripheral amorphous silicon layer under the thin-out regions are exposed to form a plurality of staircase structures. Finally, a plurality of pixel electrodes is formed over the substrate to cover the respective staircase structures and electrically connect to one source/drain electrode.

21 Claims, 11 Drawing Sheets

METHOD OF FABRICATING THIN FILM TRANSISTOR ARRAY SUBSTRATE AND STACKED THIN FILM STRUCTURE

CROSS REFERENCE TO RELATED APPLICATIONS

This application claims the priority benefit of Taiwan application serial no. 93105043, filed Feb. 27, 2004.

BACKGROUND OF INVENTION

1. Field of the Invention

The present invention relates to a method of fabricating a thin film transistor array substrate and a stacked thin film structure. More particularly, the present invention relates to a method of increasing the production yield of thin film transistor array substrate and stacked thin film structure.

2. Description of the Related Art

Great advances in multimedia communication come about with the breakthroughs in semiconductor fabrication and development in man-machine interfaces. Cathode ray tube (CRT) used to be the principle type of displays in the market because of its reliability and moderate pricing. However, in an environment with a multiple of desktop terminals/displays, the demand for environmentally friendly equipment is so acute that the bulky and power-zapping CRT no longer meets the demands of consumers. In the search for alternatives, thin film transistor liquid crystal displays (TFT LCD), which is light, radiation free and able to produce high-quality pictures at a low power rating have gradually become mainstream display products.

The display panel of most color thin film transistor liquid crystal displays mainly comprises a thin film transistor array substrate, a color filter array substrate and a liquid crystal layer. The thin film transistor array substrate includes an array of thin film transistors on a glass panel, a plurality of pixel electrodes that correspond to the thin film transistor and a plurality of scan lines and data lines. Each thin film transistor further comprises a gate, a channel, a drain and a source. The action of the liquid crystal molecules inside each pixel is controlled through these thin film transistors.

FIGS. 1A through 1C are schematic cross-sectional views showing the steps for forming a conventional thin film transistor array substrate. The method of forming a conventional thin film transistor array substrate includes the following steps. First, as shown in FIG. 1A, a substrate 100 is provided. A first metallic layer is formed over the substrate 100 and then the first metallic layer is patterned to form a gate 110 by performing photolithographic and etching processes, for example. Thereafter, a dielectric layer 120 and an amorphous silicon layer 130 are sequentially formed over the entire surface of the substrate 100. A second metallic layer is formed over the amorphous silicon layer 130. The second metallic layer is also patterned to form a source/drain 140 by performing photolitho-graphic and etching processes, for example. A passivation layer 150 is formed over the substrate 100 globally. Afterwards, a patterned photoresist layer 160 is formed over the passivation layer 150 above the source/drain 140.

As shown in FIG. 1B, using the patterned photoresist layer 160 as a mask, an isotropic etching of the passivation layer 150 is carried out to remove the passivation layer 150, the amorphous silicon layer 130 and the dielectric layer 120 exposed by the photoresist layer 160. However, in the process of etching the passivation layer 150, the amorphous silicon layer 130 and the dielectric layer 120, an etching solution with a higher etching rate on the amorphous silicon layer 130 than the dielectric layer 120 is often used. Since the exposed amorphous silicon layer 130 is completely removed before the dielectric layer 120, a portion of the amorphous silicon layer 130 on the sidewalls will be removed to form an undercut in an area labeled A.

As shown in FIG. 1C, a pixel electrode 170 is formed over the substrate 100. The pixel electrode 170 is electrically connected to the source/drain 140 through an opening in the passivation layer 150. Due to the presence of the undercut, the step coverage of the pixel electrode 170 above area A is often poor. Ultimately, this may lead to a premature break in the pixel electrode 170 and hence a failure of the pixel electrode 170 to register image signals. When breaks occur in the pixel electrode 170 frequently, the yield of thin film transistor array substrates will drop.

SUMMARY OF INVENTION

Accordingly, at least one objective of the present invention is to provide a method of fabricating a thin film transistor array substrate and stacked thin film structure capable of increasing overall process yield.

To achieve these and other advantages and in accordance with the purpose of the invention, as embodied and broadly described herein, the invention provides a method of fabricating a thin film transistor array substrate. First, a first patterned metallic layer, a dielectric layer, an amorphous silicon layer, a second patterned metallic layer and a passivation layer are sequentially formed over a substrate. The first patterned metallic layer comprises a plurality of scan lines and a plurality of scan line connected gates. The second patterned metallic layer comprises a plurality of data lines and a plurality of data line connected source/drains.

Thereafter, a patterned photoresist layer is formed over the passivation layer. The patterned photoresist layer at least covers the source/drains and surrounding areas. Furthermore, the edges of the patterned photoresist layer have a plurality of first thin-out regions. Each first thin-out region stretches over part of the edge of one source/drain.

Using the patterned photoresist layer as an etching mask, the passivation layer, the amorphous silicon layer and the dielectric layer exposed by the patterned photoresist layer is removed. In the meantime, the passivation layer under the first thin-out regions is removed to form a plurality of staircase structures that corresponds to the first thin-out regions.

Finally, a plurality of pixel electrodes is formed over the substrate. Each pixel electrode covers one staircase structure and electrically connects with one source/drain electrode.

In the process of fabricating the thin film transistor array substrate, the method of forming the patterned photoresist layer includes depositing photoresist material over the substrate to form a photoresist layer and providing a half-tone mask. Using the half-tone mask as a photomask, a front-exposure and development of the photoresist layer is carried out. The half-tone mask has transparent regions, semi-transparent regions and opaque regions. Furthermore, the first thin-out regions correspond to the semi-transparent regions of the half-tone mask.

In addition, the first patterned metallic layer and the second patterned metallic layer may further comprise a plurality of bonding pads. The bonding pads are connected to the respective terminals of the scan lines and the data lines. Furthermore, the bonding pads have a plurality of vias positioned to form an array.

Furthermore, the following steps can be used to form the patterned photoresist layer in the process of fabricating thin film transistor array substrate. First, a photoresist layer is formed over the passivation layer. Thereafter, a back-exposure operation of the photoresist layer is carried out using the first patterned metallic layer and the second patterned metallic layer as a mask. The amount of energy used in the back-exposure is just sufficient to expose a portion of the photoresist layer. Next, a front-exposure of the photoresist layer is carried out using another photomask. The photoresist layer above the source/drain is exposed in the front-exposure operation while the photoresist layer within the remaining first thin-out regions are exposed in the back-exposure operation. Finally, the photoresist layer is chemically developed. Width of the inter-via metallic layer is smaller than the photo-exposure resolution in the back-exposure operation.

The present invention also provides a method of fabricating a stacked film structure. First, a dielectric layer, an amorphous silicon layer, a first patterned metallic layer and a passivation layer are sequentially formed on the front face of a substrate. Thereafter, a patterned photoresist layer is formed over the passivation layer. Part of the edges of the patterned photoresist layer has a smaller thickness and hence forms a plurality of thin-out regions. Each thin-out region stretches across part of the edge of the first patterned metallic layer. Using the patterned photoresist layer as a mask, the passivation layer, the amorphous silicon layer and the dielectric layer exposed by the patterned photoresist layer are removed. In the meantime, the passivation layer under each thin-out region is removed to form a staircase structure that corresponds to the thin-out region.

In the process of fabricating the stacked film structure according to the present invention, the method of forming the patterned photoresist layer includes depositing photoresist layer over the passivation layer to form a photoresist layer. Thereafter, a back-exposure operation is carried out using the first patterned metallic layer as a photomask. The amount of energy used in the back-exposure is just sufficient to expose a portion of the photoresist layer. Next, a front-exposure of the photoresist layer is carried out using another photomask. Similarly, the amount of energy used in the front-exposure is just sufficient to expose a portion of the photoresist layer. The photoresist layer above the first patterned metallic layer is exposed in the front-exposure operation while the photoresist layer within the remaining first thin-out regions are exposed in the back-exposure operation. Finally, the photoresist layer is chemically developed.

In the process of fabricating the stacked film structure, the method of forming the patterned photoresist layer includes depositing photoresist material over the passivation layer to form a photoresist layer. Thereafter, a half-tone mask is used as a photomask to carry out a front-exposure and development of the photoresist layer. The half-tone mask comprises transparent regions, semi-transparent regions and opaque regions. Furthermore, each thin-out region corresponds to one of the semi-transparent regions in the half-tone mask.

In addition, in the process of fabricating the stacked film structure, a second patterned metallic layer is formed before forming the dielectric layer. After removing the passivation layer, the amorphous silicon layer and the dielectric layer using the patterned photoresist layer as an etching mask, a portion of the second patterned metallic layer is exposed. Furthermore, after removing a portion of the passivation layer, the amorphous silicon layer and the dielectric layer, a conductive layer is formed over the substrate to cover the staircase structures.

In brief, in the process of fabricating the thin film transistor array substrate and stacked film structure according to the present invention, an isotropic etching of the passivation layer is carried out using a patterned photoresist layer with thin-out regions. The thin-out regions stretch over part of the edges of the patterned metallic layer (for example, the source/drains). Hence, the conductive layer over such regions is harder to break. With a sturdier conductive layer, production yield of the thin film transistor array substrate and the stacked film structure will improve.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1A:
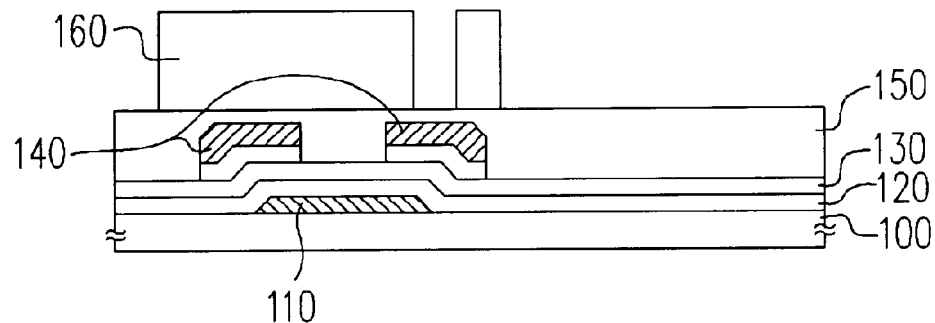
FIGS. 1A through 1C are schematic cross-sectional views showing the steps for forming a conventional thin film transistor array substrate.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
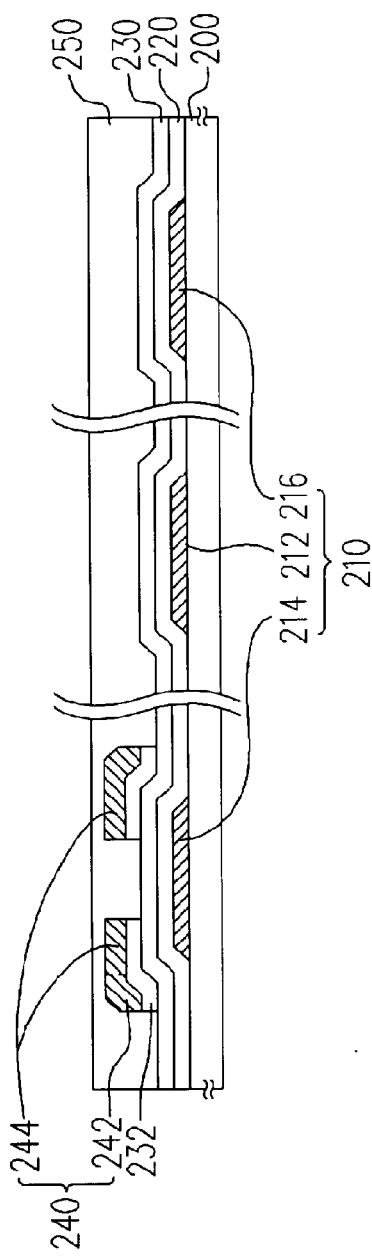
FIGS. 2A through 2D are schematic cross-sectional views showing the steps for fabricating a thin film transistor array substrate according to one embodiment of the present invention.

FIGS. 2A through 2D are schematic cross-sectional views showing the steps for fabricating a thin film transistor array substrate according to one embodiment of the present invention. As shown in FIG. 2A, a first patterned metallic layer 210, a dielectric layer 220, an amorphous silicon layer 230, a second patterned metallic layer 240 and a passivation layer 250 are sequentially formed over a substrate 200. The substrate 200 is a glass substrate or a transparent plastic substrate, for example. The first patterned metallic layer 210 comprises a plurality of scan lines 212 and a plurality of gates 214 connected to the respective scan lines 212.

The method of forming the first patterned metallic layer 210 includes forming a first metallic layer over the substrate 210. The first metallic layer is formed, for example, by performing a physical vapor deposition or a chemical vapor deposition. The first metallic layer is fabricated using a conductive material selected from a group consisting of tantalum (Ta), chromium (Cr), molybdenum (Mo), titanium (Ti) and aluminum (Al). Thereafter, a first photoresist layer is formed over the first metallic layer. The first photoresist layer is photo-exposed using a photomask and then developed to form a first patterned photoresist layer. Finally, using the first patterned photoresist layer as an etching mask, a portion of the first metallic layer is removed to form the first patterned metallic layer 210.

As shown in FIG. 2A, the dielectric layer 220 and the amorphous silicon layer 230 are formed over the substrate 200 to cover the first patterned metallic layer 210.

The dielectric layer 220 is formed, for example, by performing a plasma-enhanced chemical vapor deposition (PECVD) process or some other deposition process. The dielectric layer 220 is fabricated using a material including silicon nitride ($Si_xN_y$), silicon oxynitride (SiON), silicon oxide ($SiO_x$) or other dielectric materials. The dielectric layer 220 over the gate 214 serves as a gate insulation layer. The second patterned metallic layer 240 has a plurality of data lines 242 and a plurality of source/drains 244 connected to the respective data lines 242. The source/drains 244 are formed on the dielectric layer 220 above the gates 214.

Furthermore, the first patterned metallic layer 210 and the second patterned metallic layer 240 comprise a plurality of bonding pads 216. The bonding pads 216 are connected to the respective terminals of the scan lines 212, and the data lines 242. The bonding pads 216 are areas of electrical connection with some other devices later in a subsequent process.

In addition, the method of forming the second patterned metallic layer 240 includes forming a second metallic layer over the amorphous silicon layer 230. The second metallic layer is formed, for example, by performing a physical vapor deposition process or a chemical vapor deposition process. The second metallic layer is fabricated using a conductive material selected from a group consisting of tantalum, chromium, molybdenum and aluminum. Thereafter, a second photoresist layer is formed over the second metallic layer. A photo-exposure of the second photoresist layer is carried out and then developed to form a second patterned photoresist layer using another photomask. Finally, using the second patterned photoresist layer as an etching mask, a portion of the second metallic layer is removed to form the second patterned metallic layer 240.

After forming the amorphous silicon layer 230 but before forming the second patterned metallic layer 240, an ohmic contact layer 232 may also form between the amorphous silicon layer 230 and the second patterned metallic layer 240. The ohmic contact layer 232 is fabricated using doped amorphous silicon (n+a−Si), for example.

Thereafter, a passivation layer 250 is formed over the substrate 200 globally to cover the amorphous silicon layer 230 and the second patterned metallic layer 240. In this embodiment, the passivation layer 250 is a silicon nitride layer formed, for example, by performing a plasma-enhanced chemical vapor deposition (PECVD) process or some other process.

Figure 2B:
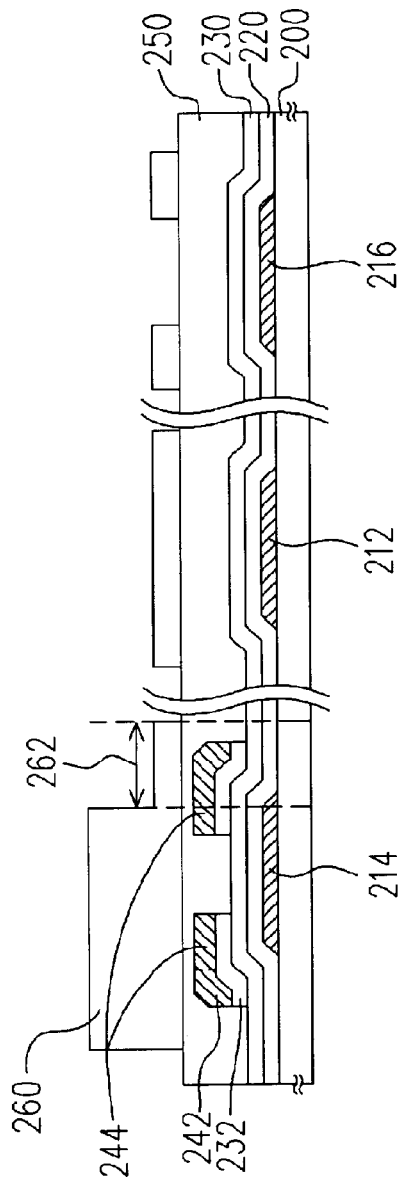
Figure 3:
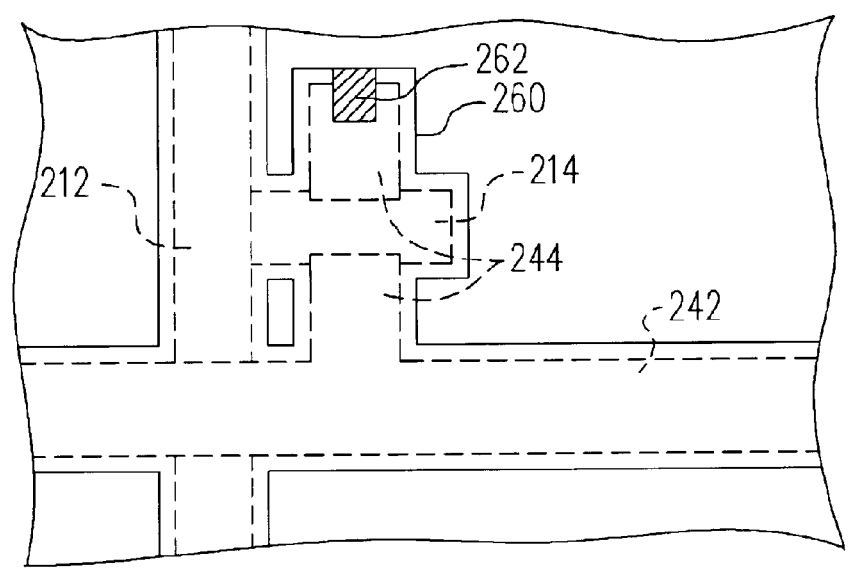
FIG. 3 is a top view showing the distribution of patterned photoresist layer close to the source/drain according to the embodiment of the present invention.

FIG. 3 is a top view showing the distribution of patterned photoresist layer close to the source/drain according to the embodiment of the present invention. As shown in FIGS. 2B and 3, a patterned photoresist layer 260 is formed over the passivation layer 250. The patterned photoresist layer 260 at least covers the source/drains 244 and its peripheral regions. In the meantime, the patterned photoresist layer 260 also covers the edges of the bonding pads 216 as well as the scan lines 212. The distribution of the patterned-photoresist layer 260 in FIG. 3 is used as an illustration only and should by no means be construed as a limitation of the present invention. In this embodiment, the patterned photoresist layer 260 may have some other pattern of distribution over the substrate. Furthermore, part of the edges of the patterned photoresist layer 260 also has a plurality of first thin-out regions 262 each having a smaller layer thickness. Each first thin-out region 262 stretches over part of the edge of one source/drain 244.

Figure 2C:
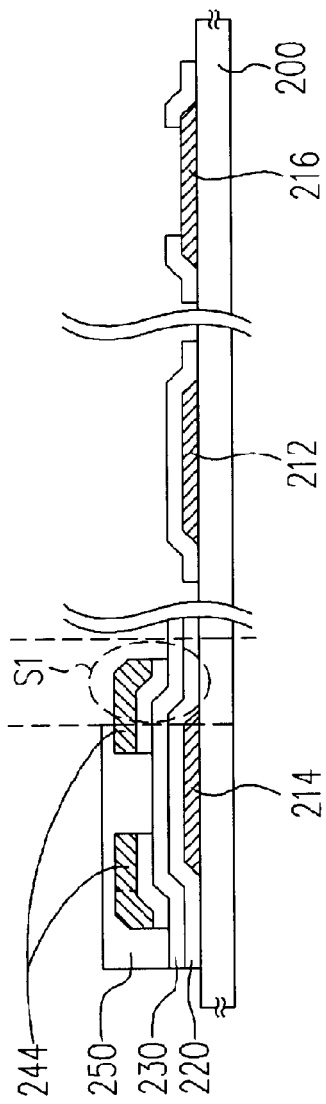

As shown in FIGS. 2B and 2C, using the patterned photoresist layer 260 as an etching mask, the passivation layer 250, the amorphous silicon layer 230 and the dielectric layer 220 exposed by the patterned photoresist layer 260 are removed. Meanwhile, the passivation layer 250 under the first thin-out regions 262 is also removed to expose the source/drains 244 and its peripheral amorphous silicon layer 230 and form a plurality of staircase structures S1. Because the patterned photoresist layer 260 covers the edges of the bonding pads 216, the central section of the bonding pads 216 are exposed. In addition, the method of removing various material layers using the patterned photoresist layer 260 as an etching mask includes isotropic etching. The isotropic etching operation is carried out using an etching solution having an etching rate for amorphous silicon layer 230 greater than the etching rate for the dielectric layer 220.

Figure 2D:
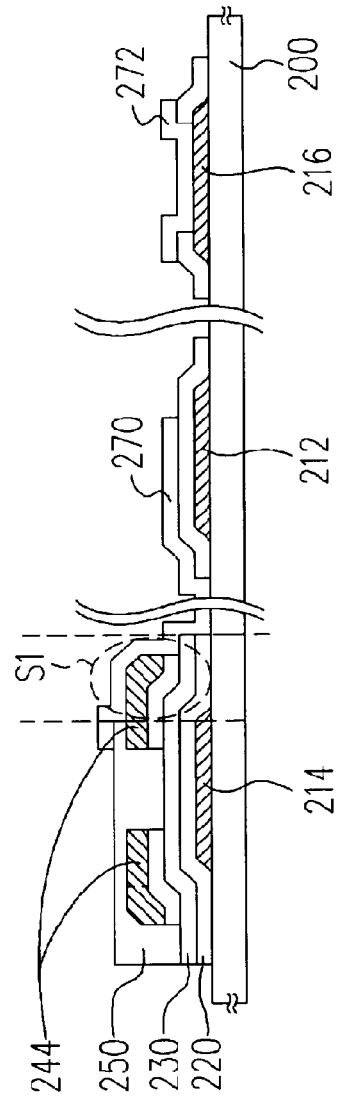

As shown in FIG. 2D, a plurality of pixel electrodes 270 is formed over the substrate 200. Each pixel electrode 270 covers one staircase structure Si and electrically connects with one source/drain 244. In addition, the pixel electrode 270 may also cover a portion of the dielectric layer 220 above the scan lines 212 so that the pixel electrode 270 and the underlying scan line 212 together with the dielectric layer 220 between the two form a pixel storage capacitor structure. In the process of forming the pixel electrode 270, an electrode material layer 272 may also form over the bonding pad 216 and electrically connect with the bonding pad 216. The pixel electrode 270 and the electrode material layer 272 are fabricated using a transparent conductive material such as indium tin oxide (ITO) or strontium tin oxide (STO), for example.

Figure 1B:
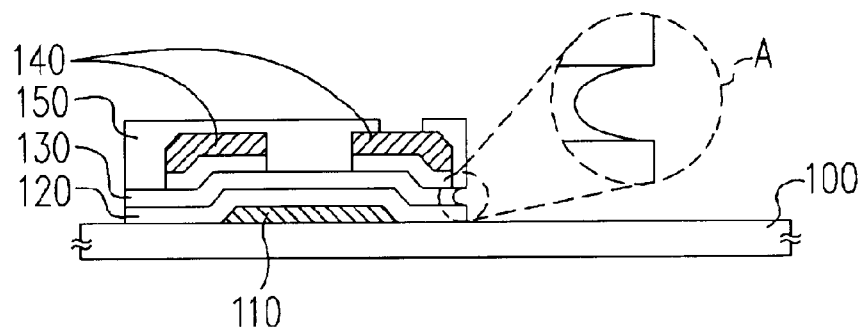
Figure 1C:
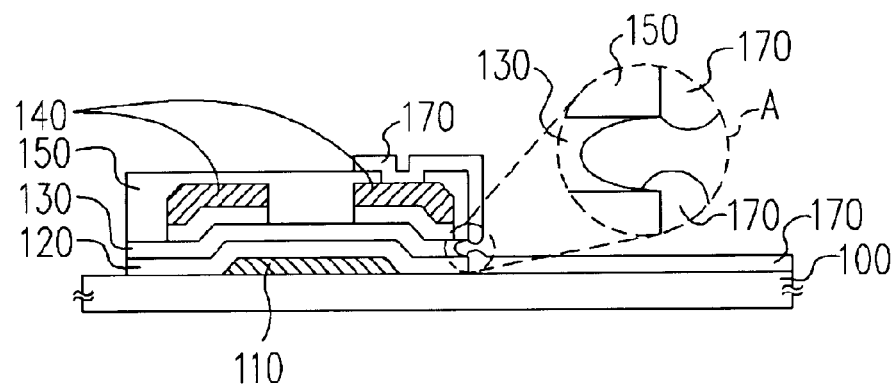

In the process of fabricating the thin film transistor array substrate, a plurality of thin-out regions 262 are formed in the patterned photoresist layer 260. Hence, a staircase structure S1 is formed on the edge of the source/drain 244. With the staircase structure Si, a discontinuous vertical wall (similar area A in FIG. 1B) will not form at the edge of the source/drain 244 even if the amorphous silicon layer 230 at the edge of the source/drain 244 has an undercut due to a difference in etching rates. In other words, cracking near the edge of the source/drain 244 within the pixel electrode 270 can be avoided.

Figure 4:
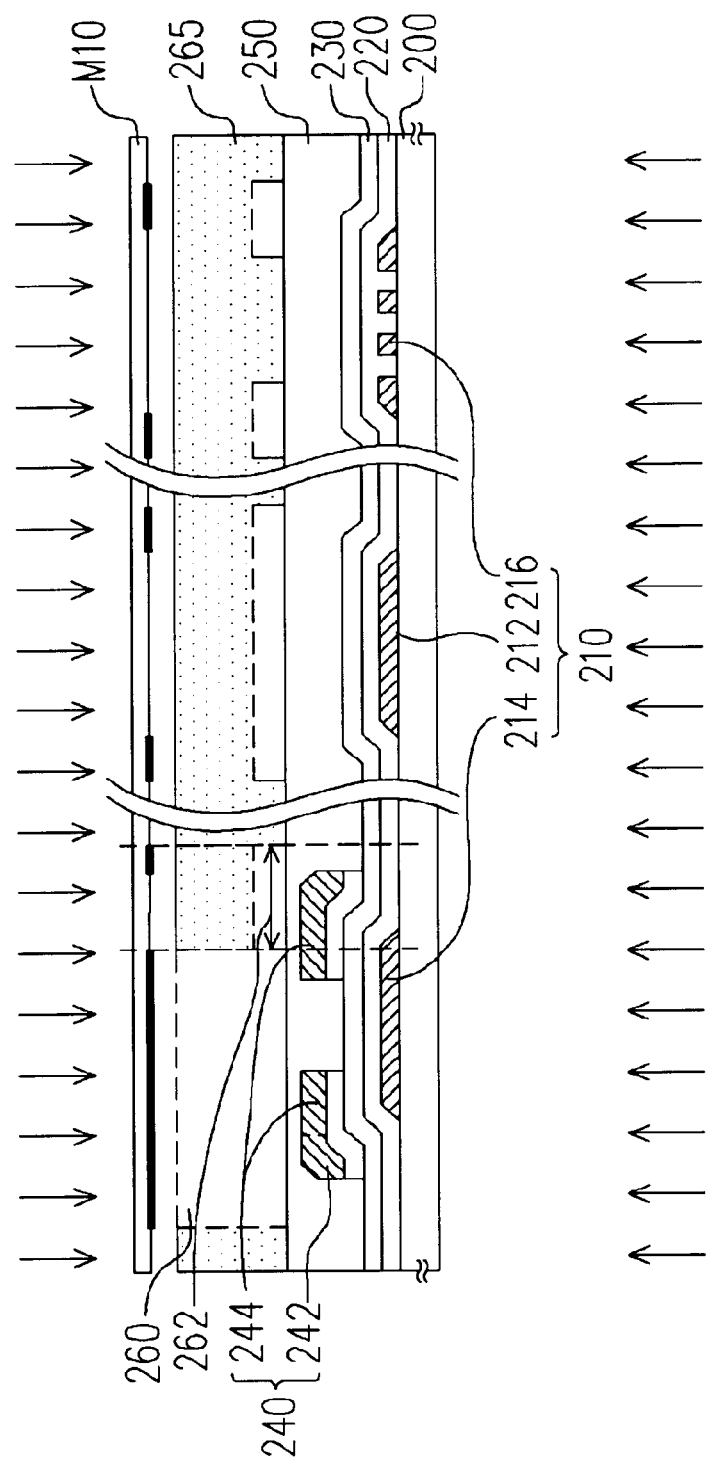
FIGS. 4 and 5 are schematic cross-sectional views showing the steps for forming patterned photoresist layer with thin-out regions in the process of fabricating the thin film transistor array substrate according to the present invention.
Figure 5:
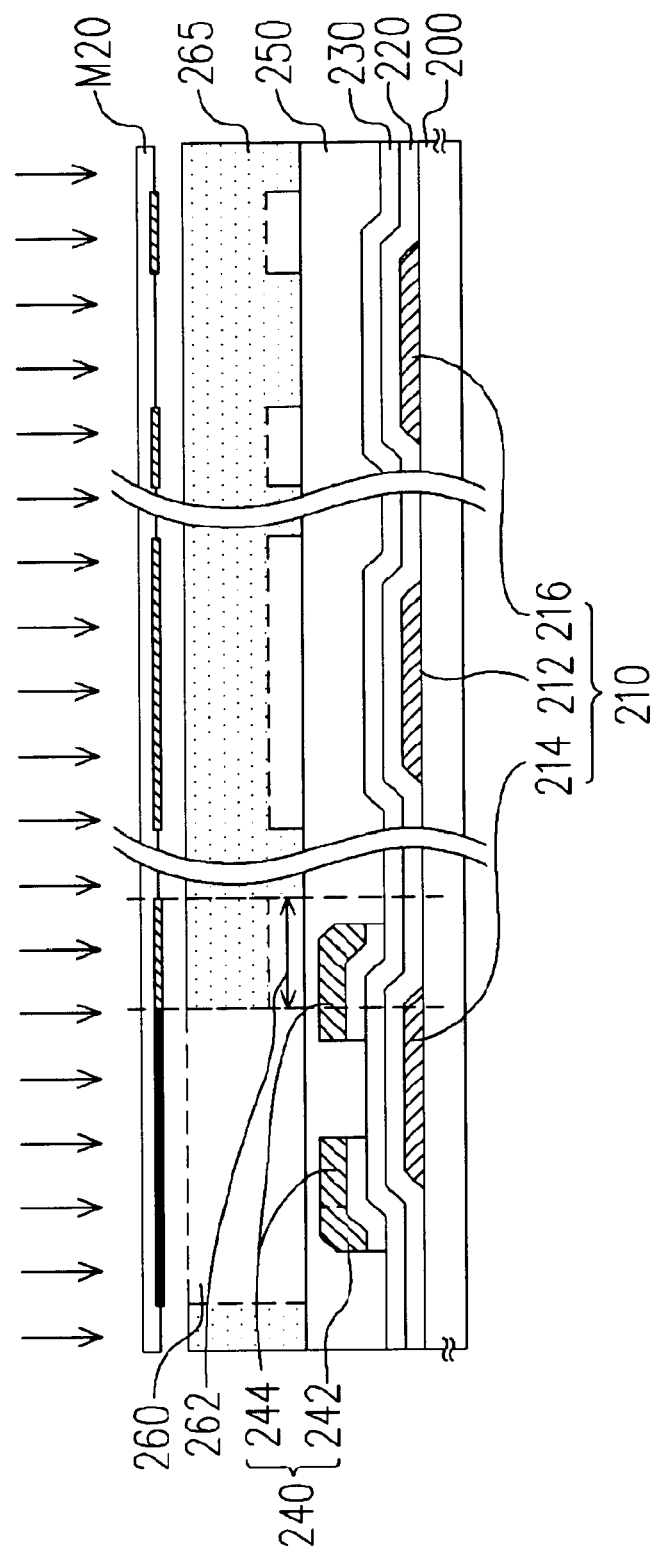

FIGS. 4 and 5 are schematic cross-sectional views showing the steps for forming patterned photoresist layer with thin-out regions in the process of fabricating the thin film transistor array substrate according to the present invention. As shown in FIG. 4, the method of forming the patterned photoresist layer 260 includes depositing photoresist material over the passivation layer 250 to form a photoresist layer 265. Thereafter, using the first patterned metallic layer 210 and the second patterned metallic layer 240 as a photomask, a back-exposure operation is carried out on the photoresist layer 265. The amount of energy used in the back-exposure is just large enough to expose a portion of the photoresist layer 265. For example, the amount of energy used in the back-exposure is set to about ⅔ of the amount of energy required for a full exposure of the photoresist layer 265. In general, the actual amount of energy used for carrying out the back-exposure can be optimized by trail-and-error according to the result of the back-exposure. Here, details of the method of adjustment are omitted.

Figure 6:
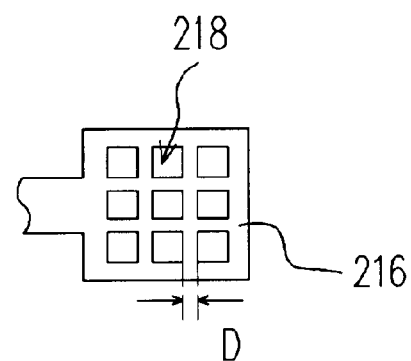
FIG. 6 is a top view of a bonding pad according to the present invention.

It should be noted that the central area of the bonding pads 216 should be hollowed out when the bonding pads are formed if the method as shown in FIG. 4 is used to form the patterned photoresist layer 260. FIG. 6 is a top view of a bonding pad according to the present invention. As shown in FIGS. 4 and 6, an array of vias 218 is formed in the bonding pad 216. Furthermore, the width D in the metallic layer between neighboring vias 218 is preferably smaller than the resolution in the back-exposure of the photoresist layer 265. Only through such an arrangement, the photoresist layer 265 above the central region of the bonding pad 216 can be partially photo-exposed in the back-exposure operation so that the central region of the bonding pad 216 are exposed after a subsequent processing operation. Obviously, the hollowed-out pattern shown in FIG. 6 is just one of the possible examples and hence should by no means be construed as a restriction on the design of the bonding pads.

Thereafter, a front-exposure operation of the photoresist layer 265 is carried out using a photomask M10. The amount of energy used in the front-exposure operation permits the photo-exposure of a portion of the photoresist layer 265 only. The actual amount of energy used in the front-exposure is similar to the one in the back-exposure operation. Within the first thin-out region 262, the photoresist layer 265 above the source/drain 244 is exposed in the front-exposure operation while the photoresist layer 265 in the remaining area of the first thin-out region 262 is exposed in the back-exposure operation. In addition, the amorphous silicon layer 230 on each side of the scan lines 212 and the amorphous silicon layer 230 on each side of the bonding pads 216 correspond with the opaque region of the photomask M10, for example. Finally, the photoresist layer 265 is developed.

The method of forming the patterned photoresist layer 260 is not limited to the one shown in FIG. 4. As shown in FIG. 5, a photoresist layer 265 is formed over the passivation layer 250. Thereafter, a half-tone photomask M20 is provided. Using the half-tone photomask M20, a front-exposure operation of the photoresist layer 265 is carried out and then the exposed photoresist layer 265 is developed. The first thin-out regions 262 correspond to the semi-transparent regions in the half-tone photomask M20. The areas adjacent to the first thin-out regions 262 but far away from the source/drains 244 correspond to the transparent regions of the half-tone photomask M20. In addition, the semi-transparent regions of the photomask M20 also correspond to areas close to the side of the bonding pads 216 and the scan lines 212.

Figure 7:
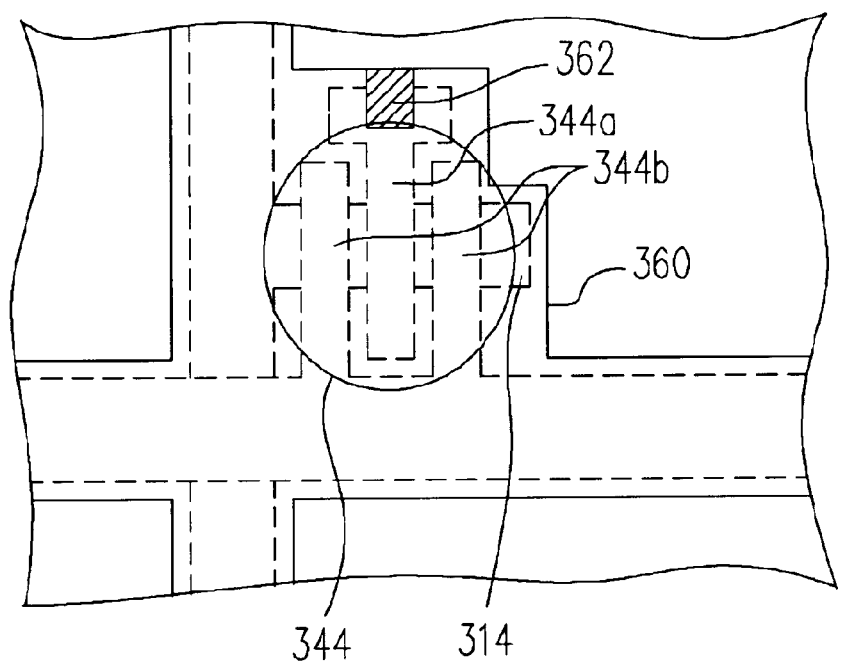
FIG. 7 is a top view showing another distribution of patterned photoresist layer close to the source/drain according to the present invention.

In the method of fabricating the thin film transistor array substrate, the actual configuration of the source/drains is not limited to the aforementioned embodiment. Other types of design variations are also permitted. FIG. 7 is a top view showing another distribution of patterned photoresist layer close to the source/drain according to the present invention. As shown in FIG. 7, the source/drain 344 comprises a first terminal 344a and a second terminal 344b, for example. The first terminal 344a has a T-shape profile and stretches over the sides of the gate 314. The second terminal 344b comprise a pair of linear strips positioned on each side of the first terminal 344a and stretched over the sides of the gate 314. With this design, deterioration of thin film transistor performance due to alignment errors between the source/drain 344 and the gate 314 is significantly minimized. Furthermore, the patterned photoresist layer 360 at least covers the source/drain 344 and its peripheral region and part of the edges of the patterned photoresist layer 360 has a plurality of first thin-out regions 362 having a smaller film thickness. In addition, each first thin-out region 362 stretches over part of the edge of one source/drain 344.

Figure 8:
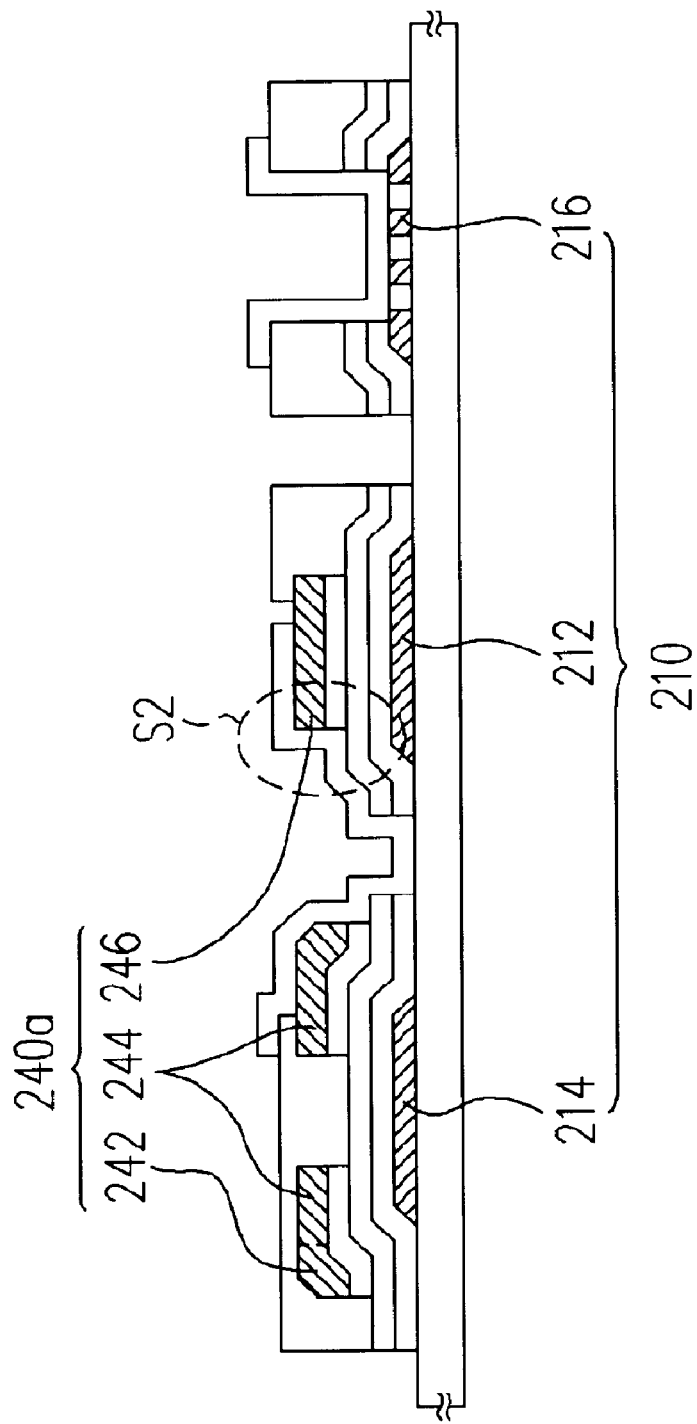
FIG. 8 is a schematic cross-sectional view of a thin film transistor array substrate of another embodiment of the present invention.

FIG. 8 is a schematic cross-sectional view of a thin film transistor array substrate of another embodiment of the present invention. The method of fabricating the thin film transistor array substrate in FIG. 8 is very similar to the method as shown in FIGS. 2A through 2D. One major difference is that a plurality of capacitor electrodes 246 is also formed when the second patterned metallic layer 240a is fabricated. The capacitor electrodes 246 are located over part of the scan lines 212. The capacitor electrode 246 and the scan line 212 together with the dielectric layer 220 between the two form a pixel storage capacitor. In addition, the process of forming the patterned photoresist layer (not shown) further includes forming a plurality of second thin-out regions on part of the edges of the patterned photoresist layer. Each second thin-out region stretches over part of the edges of one capacitor electrode 246 so that one side of the capacitor electrode 246 forms a staircase structure S2. In this embodiment, the remaining steps for fabricating the thin film transistor array substrate are identical to the aforementioned embodiment. Hence, the chance of cracking of the pixel structure 270 when the pixel structure 270 is set up over the staircase structure S2 is greatly minimized.

Figure 9A:
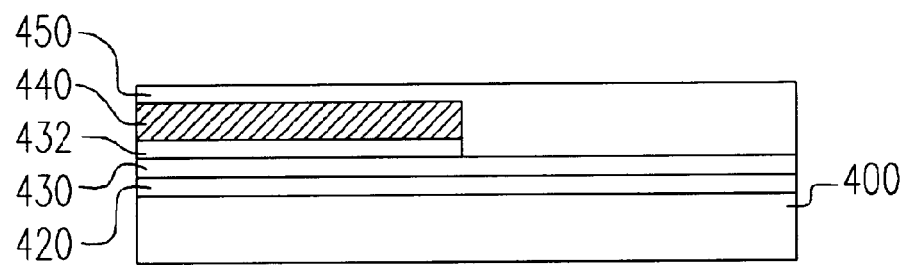
FIGS. 9A through 9C are schematic cross-sectional views showing the steps for fabricating a stacked film structure according to one embodiment of the present invention.
Figure 9B:
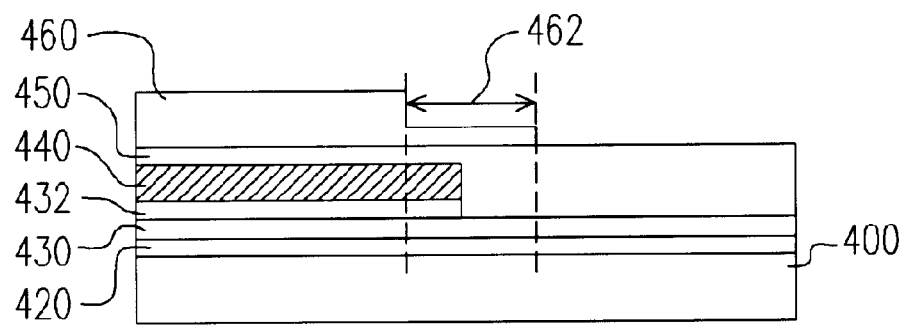
Figure 9C:
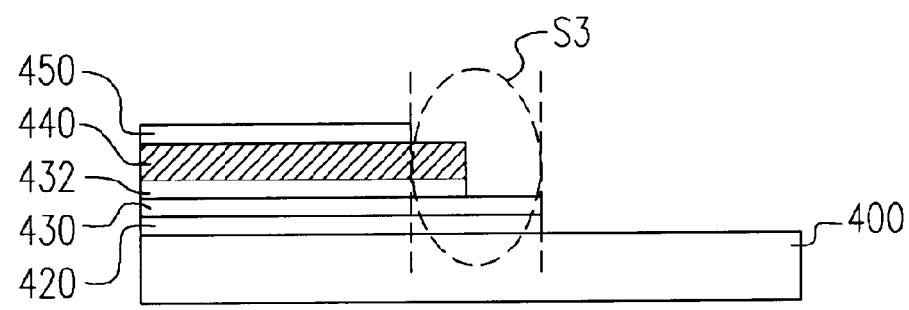

The aforementioned technique of fabricating the thin film transistor array substrate can be applied to other locations on the substrate as well. FIGS. 9A through 9C are schematic cross-sectional views showing the steps for fabricating a stacked film structure according to one embodiment of the present invention. As shown in FIG. 9A, a dielectric layer 420, an amorphous silicon layer 430, a first patterned metallic layer 440 and a passivation layer 450 are sequentially formed on a front surface of a substrate 400. An ohmic contact layer 432 is also formed between the amorphous silicon layer 430 and the first patterned metallic layer 440.

Thereafter, a patterned photoresist layer 460 is formed over the passivation layer 450. Part of the edges of the patterned photoresist layer 460 has a thin-out region 462 with a smaller layer thickness. Furthermore, the thin-out region 462 stretches over part of the edges of the first patterned metallic layer 440.

Using the patterned photoresist layer 460 as an etching mask, the passivation layer 450, the amorphous silicon layer 430 and the dielectric layer 420 outside the patterned photoresist layer 460 are removed. In the meantime, the passivation layer 450 under the thin-out region 462 is also removed to form a staircase structure S3 that corresponds with the thin-out region 462.

After removing the passivation layer 450, amorphous silicon layer 430 and the dielectric layer 420 outside the patterned photoresist layer 420, a conductive layer 470 is formed over the substrate 400. The conductive layer 470 covers the staircase structure S3. Since the conductive layer 470 is formed over the staircase structure S3, the conductive layer 470 is less vulnerable to break due to any undercut phenomenon. The conductive layer 470 is fabricated using a transparent conductive material such as indium tin oxide (ITO) or strontium tin oxide (STO), for example.

Figure 10:
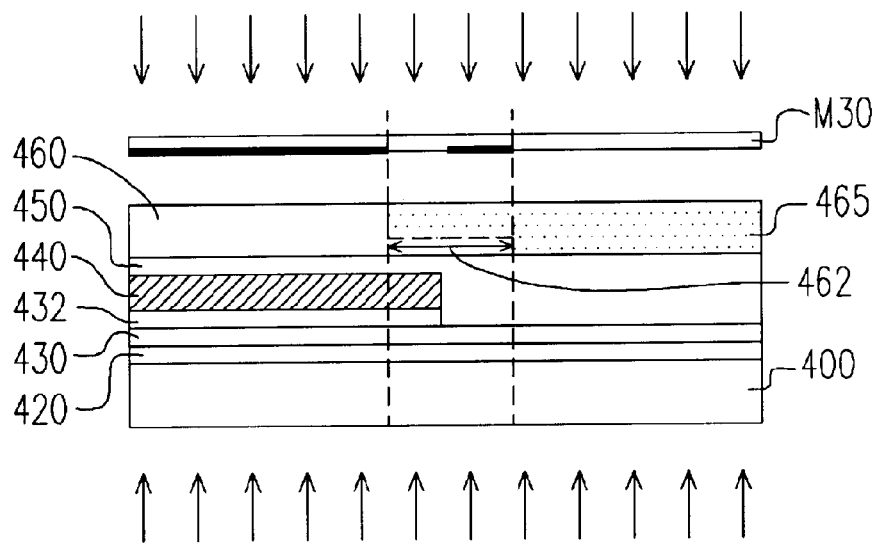
FIGS. 10 and 11 are schematic cross-sectional views showing the steps for forming patterned photoresist layer with thin-out regions in the process of fabricating the stacked film structure according to the present invention.
Figure 11:
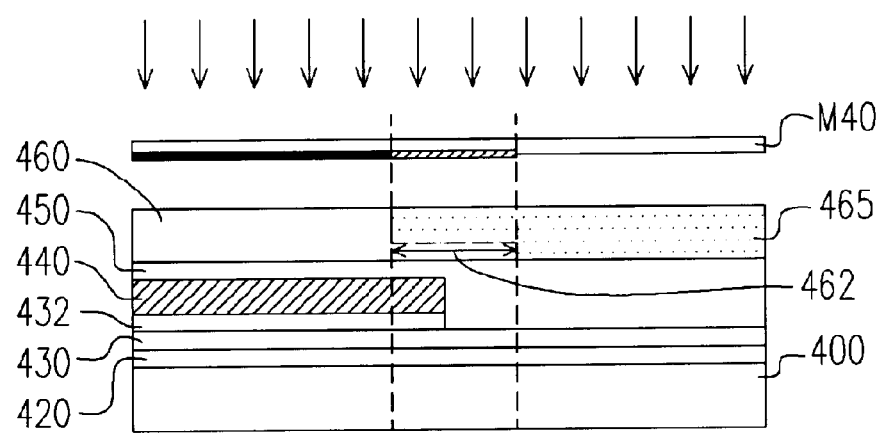

FIGS. 10 and 11 are schematic cross-sectional views showing the steps for forming patterned photoresist layer with thin-out regions in the process of fabricating the stacked film structure according to the present invention. As shown in FIG. 10, the method of forming the patterned photoresist layer 460 includes depositing photoresist material over the passivation layer 450 to form a photoresist layer 465. Thereafter, using the first patterned metallic layer 440 as a photomask, a back-exposure operation of the photoresist layer 465 is carried out. The amount of energy used in the back-exposure is just enough to expose a portion of the photoresist layer 465.

Thereafter, using another photomask M30, a front-exposure operation of the photoresist layer 465 is carried out with an amount of energy just enough to expose a portion of the photoresist layer 465. Within the thin-out regions 462, the photoresist layer 465 above the first patterned metallic layer 440 is exposed in the front-exposure operation while the remaining areas are exposed in the back-exposure operation. The amount of energy used to carry out each photo-exposure operation is determined in a similar way to the one described in FIG. 4. Finally, the photoresist layer 465 is developed.

As shown in FIG. 11, the method of forming the patterned photoresist layer 460 is not limited to the one shown in FIG. 10. In an alternative method, a photoresist layer 465 is formed over the passivation layer 450. Thereafter, a half-tone photomask M40 is provided. Using the half-tone photomask M40, a front-exposure of the photoresist layer 465 is carried out and then the photoresist layer 465 is developed. The half-tone photomask M40 has transparent regions, semi-transparent regions and opaque regions. Furthermore, the thin-out regions 462 correspond to the semi-transparent regions of the half-tone photomask M40 and areas on the side of the thin-out regions away from the first patterned metallic layer 440 correspond to the transparent regions of the half-tone photomask M40.

Figure 12:
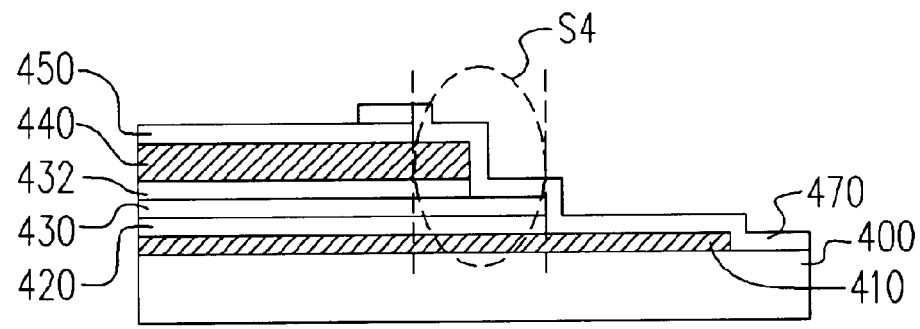
FIG. 12 is a schematic cross-sectional view of a stacked thin film structure according to another embodiment of the present invention.

FIG. 12 is a schematic cross-sectional view of a stacked thin film structure according to another embodiment of the present invention. As shown in FIG. 12, the method of fabricating the stacked film structure includes forming a second patterned metallic layer 410 before forming the dielectric layer 420. Furthermore, after removing the passivation layer 450, the amorphous silicon layer 430 and the dielectric layer 420 exposed by the patterned photoresist layer 460, a portion of the second patterned metallic layer 410 is exposed. In this embodiment, the remaining steps for fabricating the stacked film structure is similar to the aforementioned embodiment. In other words, a staircase structure S4 is similarly formed. Hence, the method is capable of preventing cracking in the conductive layer 470 due to any undercut after the conductive layer 470 is formed over the staircase structure S4 for electrically connecting the second patterned metallic layer 410 with the first patterned metallic layer 440.

Figure 13:
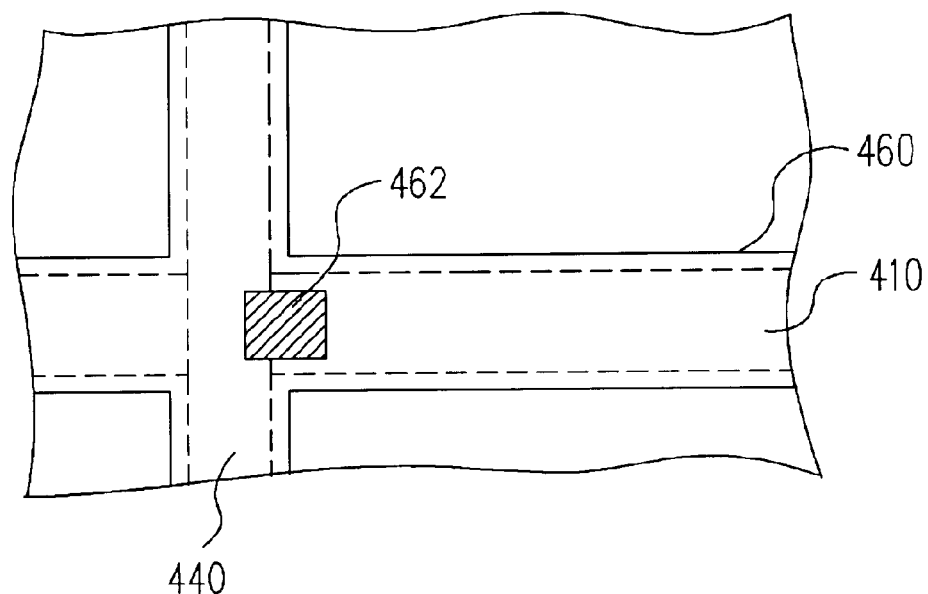
FIG. 13 is a top view showing the distribution of patterned photoresist layer in the process of fabricating the stacked film structure according to the present invention.

FIG. 13 is a top view showing the distribution of patterned photoresist layer in the process of fabricating the stacked film structure according to the present invention. As shown in FIG. 13, the method of fabricating the stacked film structure can be applied to repair structures in the thin film transistor array substrate as well. Part of the edge of the patterned photoresist layer 460 has a thin-out region 462. Furthermore, the thin-out region 462 stretches over part of the edge of the first patterned metallic layer 440.

In summary, in the process of fabricating the thin film transistor array substrate and stacked film structure according to the present invention, a patterned photoresist layer with thin-out regions thereon is formed before etching the passivation layer. The thin-out regions stretch over part of the edges of the patterned metallic layer (for example, the source/drains). Thereafter, using the patterned photoresist layer as an etching mask, an isotropic etching operation is carried out to remove the passivation layer under the thin-out regions completely. Moreover, the amorphous silicon layer extends over the edge of the patterned metallic layer so that the conductive layer covering this region is less vulnerable to break even if any undercutting of the amorphous silicon layer occurs during the isotropic etching process. Ultimately, overall production yield of thin film transistor array substrate and stacked film structure will improve.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a thin film transistor array substrate, comprising the steps of:

providing a substrate;

forming a first patterned metallic layer, a dielectric layer, an amorphous silicon layer, a second patterned metallic layer and a passivation layer over the substrate in sequence, wherein the first patterned metallic layer comprises a plurality of scan lines and a plurality of gates connected to the respective scan lines and the second patterned metallic layer comprises a plurality of data lines and a plurality of source/drains connected to the respective data lines;

forming a patterned photoresist layer over the passivation layer, wherein the patterned photoresist layer at least covers the source/drains and its peripheral regions, part of the edges of the patterned photoresist layer has a plurality of thin-out regions with a smaller layer thickness, and each first thin-out region stretches over part of the edge of one source/drain;

removing the passivation layer, the amorphous silicon layer and the dielectric layer exposed by the patterned photoresist layer using the patterned photoresist layer as an etching mask to form a plurality of staircase structure that correspond to the first thin-out regions; and forming a plurality of pixel electrodes over the substrate such that each pixel electrode at least covers one of the staircase structures and electrically connects with one of the source/drains.

2. The method of claim 1, wherein the step of forming the patterned photoresist layer comprises:

forming a photoresist layer over the passivation layer; and providing a half-tone photomask and performing a front-exposure and development of the photoresist layer using the half-tone photomask, wherein the half-tone photomask has transparent regions, semi-transparent regions and opaque regions, and the first thin-out regions correspond to the semi-transparent regions in the half-tone photomask.

3. The method of claim 1, wherein the first patterned metallic layer and the second patterned metallic layer further comprises a plurality of bonding pads connected to the respective terminals of the scan lines and the data lines and each bonding pads has a plurality of vias organized to form an array.

4. The method of claim 3, wherein the step of forming the patterned photoresist layer comprises:

forming a photoresist layer over the passivation layer;

performing a back-exposure of the photoresist layer using the first patterned metallic layer and the second metallic layer as a photomask such that the amount of energy used in the back-exposure is enough just to expose a portion of the photoresist layer;

providing a photomask and performing a front-exposure of the photoresist layer using the photomask such that the amount of energy used in the front-exposure is enough just to expose a portion of the photoresist layer, wherein the photoresist layer above the source/drains within the fist thin-out regions are exposed in the front-exposure operation and the remaining areas within the first thin-out regions are exposed in the back-exposure operation; and developing the photoresist layer.

5. The method of claim 4, wherein the metallic layer between neighboring vias has a width smaller than the back-exposure resolution during the back-exposure operation.

6. The method of claim 1, wherein the second patterned metallic layer further comprises a plurality of capacitor electrodes located above some of the scan lines and part of the edges of the patterned photoresist layer further comprises a plurality of second thin-out regions with a smaller layer thickness and each second thin-out region stretches over part of the edge of one capacitor electrode.

7. The method of claim 1, wherein the step of forming the first patterned metallic layer comprises:

forming a first metallic layer over the substrate;

forming a first patterned photoresist layer over the first metallic layer; and removing a portion of the first metallic layer using the first patterned photoresist layer as an etching mask.

8. The method of claim 1, wherein the step of forming the second patterned metallic layer comprises:

forming a second metallic layer over the amorphous silicon layer;

forming a second patterned photoresist layer over the second metallic layer; and removing a portion of the second metallic layer using the second patterned photoresist layer as an etching mask.

9. The method of claim 1, wherein after forming the amorphous silicon layer but before forming the second patterned metallic layer, further comprises forming an ohmic contact layer between the amorphous silicon layer and the second patterned metallic layer.

10. The method of claim 1, wherein the step of removing the material layers comprises performing an isotropic etching process.

11. The method of claim 10, wherein the step of removing the material layers comprises performing an etching operation using an etching solution having a greater etching rate on the amorphous silicon layer than the dielectric layer.

12. A method of fabricating a stacked film structure, comprising the steps of:

providing a substrate;

forming a dielectric layer, an amorphous silicon layer, a first patterned metallic layer and a passivation layer over a front surface of the substrate in sequence;

forming a patterned photoresist layer over the passivation layer, wherein part of the edges of the patterned photoresist layer has thin-out regions with a smaller layer thickness and each thin-out region stretches over part of the edges of the first patterned metallic layer; and removing the passivation layer, the amorphous silicon layer and the dielectric layer exposed by the patterned photoresist layer using the patterned photoresist layer as an etching mask and removing the passivation layer under the thin-out regions to form staircase structures that correspond to the thin-out regions.

13. The method of claim 12, wherein before forming the dielectric layer further comprises forming a second patterned metallic layer and a portion of the second patterned metallic layer is exposed after removing the passivation layer, the amorphous silicon layer and the dielectric layer exposed by the patterned photoresist layer.

14. The method of claim 13, wherein the step of forming the patterned photoresist layer comprises:

forming a photoresist layer over the passivation layer; and providing a half-tone photomask and using the half-tone photomask to perform a front-exposure of the photoresist layer, wherein the half-tone photomask has transparent regions, semi-transparent regions and opaque regions and the thin-out regions correspond to the semi-transparent regions in the half-tone photomask.

15. The method of claim 13, wherein the step of forming the patterned photoresist layer comprises:

forming a photoresist layer over the passivation layer;

performing a back-exposure of the photoresist layer using the first patterned metallic layer as a photomask such that the amount of energy used in the back-exposure is enough just to expose a portion of the photoresist layer;

providing a photomask and using the photomask to perform a front-exposure of the photoresist layer such that the amount of energy used in the front-exposure is enough just to expose a portion of the photoresist layer, wherein the photoresist layer above the first patterned metallic layer within the thin-out regions are exposed in the front-exposure operation and the areas in the remaining thin-out regions are exposed in the back-exposure operation; and developing the photoresist layer.

16. The method of claim 12, wherein the step of forming the patterned photoresist layer comprises:

forming a photoresist layer over the passivation layer; and providing a half-tone photomask and using the half-tone photomask to perform a front-exposure of the photoresist layer, wherein the half-tone photomask has transparent regions, semi-transparent regions and opaque regions and the thin-out regions correspond to the semi-transparent regions in the half-tone photomask.

17. The method of claim 12, wherein the step of forming the patterned photoresist layer comprises:

forming a photoresist layer over the passivation layer;

performing a back-exposure of the photoresist layer using the first patterned metallic layer as a photomask such that the amount of energy used in the back-exposure is enough just to expose a portion of the photoresist layer;

providing a photomask and using the photomask to perform a front-exposure of the photoresist layer such that the amount of energy used in the front-exposure is enough just to expose a portion of the photoresist layer, wherein the photoresist layer above, the first patterned metallic layer within the thin-out regions are exposed in the front-exposure operation and the areas in the remaining thin-out regions are exposed in the back-exposure operation; and developing the photoresist layer.

18. The method of claim 12, wherein the step of removing the material layers comprises performing an isotropic etching process.

19. The method of claim 18, wherein the step of removing the material layers comprises performing an etching operation using an etching solution having a greater etching rate on amorphous silicon than the dielectric layer.

20. The method of claim 12, wherein after removing a portion of the passivation layer, the amorphous silicon layer and the dielectric layer, further comprises forming a conductive layer over the substrate such that the conductive layer covers the staircase structure.

21. The method of claim 12, wherein after forming the amorphous silicon layer but before forming the first pattern metallic layer, further comprises forming an ohmic contact layer between the amorphous silicon layer and the first patterned metallic layer.

* * * * *